United States Patent [19]

Hewitt et al.

[11] Patent Number: 5,488,711

[45] Date of Patent: Jan. 30, 1996

[54] SERIAL EEPROM DEVICE AND ASSOCIATED METHOD FOR REDUCING DATA LOAD TIME USING A PAGE MODE WRITE CACHE

[75] Inventors: Kent D. Hewitt, Tempe; Samuel E. Alexander, Gilbert; Richard J. Fisher, Phoenix, all of Ariz.

[73] Assignee: Microchip Technology Incorporated, Chandler, Ariz.

[21] Appl. No.: 41,076

[22] Filed: Apr. 1, 1993

[51] Int. Cl.$^6$ .................. G06F 13/28; G06F 13/36; G11C 16/04

[52] U.S. Cl. .................. 395/430; 395/445; 395/453; 365/238.5

[58] Field of Search .................. 395/425, 430, 395/445, 453; 365/185, 900, 230.03, 238.5

[56] References Cited

U.S. PATENT DOCUMENTS

| | | | |
|---|---|---|---|
| 4,642,763 | 2/1987 | Cummins | 395/700 |
| 4,894,770 | 1/1990 | Ward et al. | 395/425 |
| 5,134,583 | 7/1992 | Matsuo et al. | 365/238.5 |
| 5,172,338 | 12/1992 | Mehrotra et al. | 365/185 |
| 5,297,148 | 3/1994 | Harari et al. | 371/10.1 |
| 5,299,161 | 3/1994 | Choi | 365/201 |
| 5,327,570 | 7/1994 | Foster et al. | 395/425 |

*Primary Examiner*—Glenn Gossage
*Attorney, Agent, or Firm*—O'Connor Cavanagh

[57] ABSTRACT

A serial EEPROM (electrically erasable programmable read only memory) device and method for reducing the time required to load data into the serial EEPROM device using a special write cache are disclosed. The EEPROM has an internal memory array for receiving a burst of data sent by a microcontroller. Data in the burst of data is initially loaded into an SRAM (static random access memory) write cache where it is stored sequentially and grouped in a plurality of pages, so that the bus and the microcontroller are freed to allow the microcontroller to perform other processing tasks at least until the EEPROM memory is written and the EEPROM is again accessible to the microcontroller. Writing of the internal memory array is accomplished sequentially with data from the pages of the cache loaded into rows of the internal memory array until the cache is depleted, the pages being sized so that an integral number of pages is stored in each row of the internal memory array.

5 Claims, 3 Drawing Sheets

SERIAL EEPROM DEVICE AND ASSOCIATED METHOD FOR REDUCING DATA LOAD TIME USING A PAGE MODE WRITE CACHE

BACKGROUND OF THE INVENTION

The present invention relates generally to semiconductor integrated circuit (IC) memory chips or other monolithic devices, and more particularly to serial erasable programmable memory devices such as electrically erasable (alterable) programmable read only memories (serial EEPROMs). EEPROM devices generally have the advantage that data may be written and rapidly erased electrically many times over, to permit a user to modify stored data at will while the device is in circuit.

ROM (Read Only Memory) devices are permanently mask-programmed at the factory so that no subsequent data modification is permitted. Originally, programmable ROMs (PROMs) employed fusible links in which data is stored according to the condition of the fuses at intersections of the memory array, i.e., the condition of whether or not a fuse is blown. Such PROM devices are programmable only once (that is, are non-erasable) since a blown metal or polysilicon link fuse is not reparable.

Erasable PROM (EPROM) devices require exposure of the unhoused structure to ultraviolet (UV) light to change the electrical characteristics of a charged element in order to obtain erasure. Typically, the EPROM is housed in a windowed package (e.g., a ceramic package having a quartz window to expose the silicon), although a more recent version dubbed as "one time programmable" (OTP) is packaged in plastic without a window. As the name indicates, the windowless variety can be programmed only once. The usual windowed EPROM is reprogrammable after removal from its in-system circuit, by exposing the device to UV light for a sufficient period of time (several hours) to assure complete erasure, then electrically reprogramming and reinstalling it in the circuit.

Since EEPROM devices are selectively erasable in circuit, they are the memory devices of choice in applications where in-system changes of stored data and/or relatively fast data changes may be required. Serial EEPROMs are nonvolatile memories that provide small footprint and board space as required in cellular phone applications; byte level erase, write and read of data as needed in television tuner applications; low voltage and current for hand held battery applications such as vehicle keyless entry transmitters; and multiple nonvolatile functions such as remote controls for video cassette recorders CVCR. Although the following list is not exhaustive, other applications of serial EEPROM devices include, in the consumer market, compact-disc (CD) players, cameras, radios and remote controls; in the automotive market, airbags, anti-lock brakes, odometers and radios; in the office automation market, printers, copiers and personal computers; in the telecommunications market, cordless and full feature phones, fax machines, modems, pagers and satellite receivers; and in the industrial market, bar code readers, Point of sale (POS) terminals, smart cards, lock boxes, garage door openers and test measurement equipment.

In the EEPROM structure, a pair of polysilicon gates are separated by a silicon dioxide layer. The oxide also extends below the lower gate to separate it from the underlying p-type silicon substrate in which a channel may be established between implanted heavily doped n-type source and drain regions. The oxide thickness between the lower gate and the silicon typically ranges up to about 100 angstroms, which is considerably less than the gate oxide thickness used for EPROM structures.

In operation of an EEPROM, a voltage of suitable magnitude applied across the very thin gate oxide layer induces tunneling of electrons from the substrate to the lower gate. A logical 1 is stored (written) when a write voltage is applied to the upper gate, thus inducing a charge on the lower gate that prevents a channel from forming during a read operation. A reversal of the write voltage causes erasure.

Despite their many advantages over other programmable semiconductor memory devices for certain applications, EEPROMs require programming or erase/write (E/W) times of sufficient length to constitute a serious drawback to their use. During programming, the associated microprocessor or microcontroller, for which the EEPROM is employed to provide additional memory in embedded control system applications, remains tied up and unable to perform other tasks until the programming is completed.

It is a principal object of the present invention to free up the microprocessor or microcontroller associated with an EEPROM device so that other tasks may be performed while the EEPROM is being written.

SUMMARY OF THE INVENTION

Briefly, according to the present invention, a serial EEPROM device is provided with an SRAM (static random access memory) page mode write cache which will allow the EEPROM to receive a serial data stream in a burst of byte length that depends on the capacity (size) of the cache, up to 64 bytes in the embodiment described herein, at SRAM speeds. This improvement eliminates an architectural concern with the EEPROM interface, providing the advantage of reducing the time required for the system controller to interface to the EEPROM.

The cache can be loaded with a 64 byte burst of data, as one example, and the associated data bus and microcontroller released while the data is written sequentially from the cache. The write cache holds the data grouped in a plurality of pages until written to the array. This differs from a conventional page mode write which is a common feature employed in EEPROMs to reduce programming time. In the standard page mode write, the EEPROM can receive several data bytes, store them in special latches, and then write all the stored data to the memory array in a single write cycle. Although that implementation serves to reduce total programming time, it has limited usefulness as a burst mode data buffer because a page is generally mapped to a physical row in the memory array (i.e., one page equals one row). Therefore, the maximum data buffer size is determined and limited by the number of bytes in one row of the memory array.

In contrast, use of SRAM write cache as a data buffer in combination with page mode write maintains the programming time advantage over byte writes, while the burst mode data buffer size becomes a function of the amount of SRAM added to the EEPROM, rather than the page (row) size. The increased data buffer size allows the microcontroller, for example, to send a large amount of data to the EEPROM in a burst mode and then to devote itself to performing other tasks or activities while the programming is underway.

As data is received by the EEPROM during the load cycle, it is stored in the SRAM write cache. At the end of the data burst, the EEPROM enters a programming cycle and writes the data contained in the SRAM write cache to the internal memory array using sequential page mode writes. The time required to execute a programming cycle is equal to the amount of data stored in the SRAM write cache divided by the page size multiplied by the time to complete a page write.

Therefore, a more specific object of the invention is to reduce the time a microcontroller must spend to load data into an EEPROM, by using an SRAM write cache as a data buffer in combination with page mode write, for receipt and storage of serial data in a burst by the SRAM cache until the burst ends, at which point the bus carrying the data burst from the microcontroller becomes accessible and the microcontroller is free to perform other tasks throughout the writing of the data from the cache to the memory array of the EEPROM.

BRIEF DESCRIPTION OF THE DRAWINGS

The above and other objects, features and advantages of the invention will become clear from the following detailed description of the best mode presently contemplated for practicing the invention, with reference to the accompanying drawings in which.

DETAILED DESCRIPTION OF THE PREFERRED EMBODIMENT AND METHOD

Figure 1:
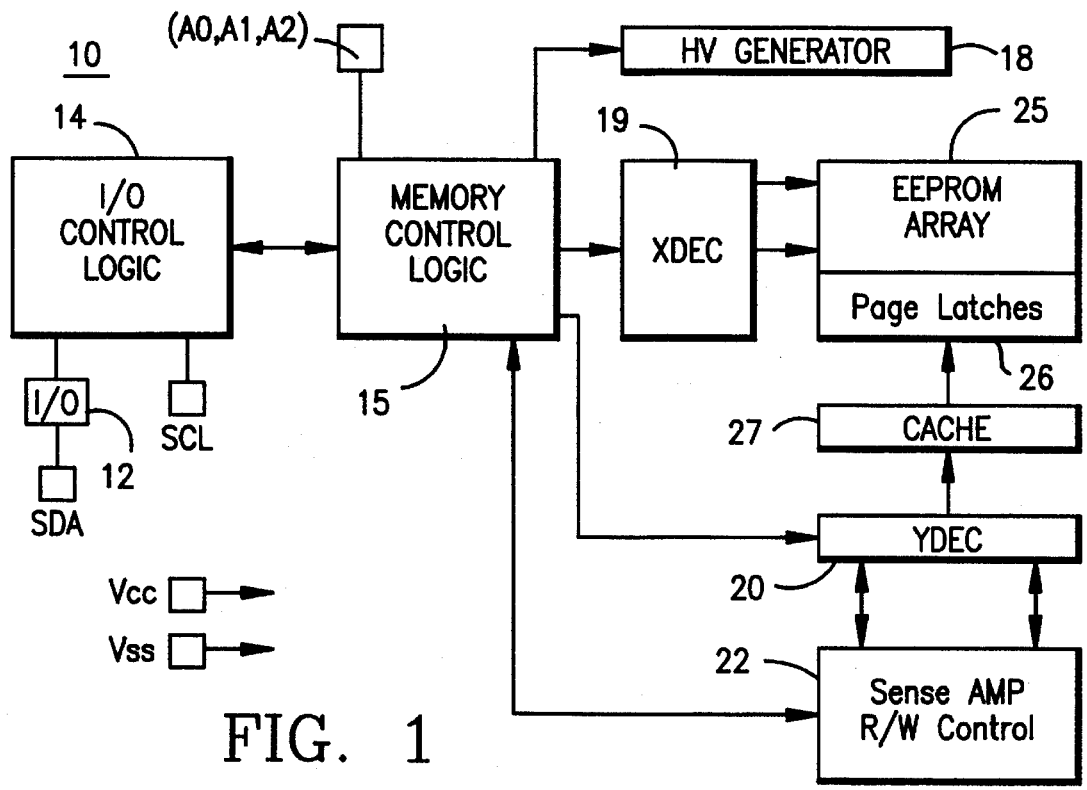
FIG. 1 is a block diagram of a serial EEPROM in which the preferred embodiment of the invention is implemented.

In an exemplary embodiment, the invention is implemented in a 64K (8K× 8) low voltage serial EEPROM 10 (FIG. 1) which is particularly well suited for low power applications of the type mentioned above.

EEPROM 10 has pins A0, . . . , An, such as A0, A1 and A2 user configurable chip or address selects, and pins SDA (serial data/address) and SCL (serial clock). The A0, A1 and A2 chip address inputs are used for multiple device operation and may conform to the I²C (Inter Integrated Circuit) bus standard. The level on these pins defines the address block occupied by the device in an address map, so that the address may be compared to the corresponding bits in a slave address to select a particular device from among several.

The bidirectional SDA pin transfers addresses and data into the device via signal SDA IN, and data out of the device via signal SDA OUT. For normal data transfer, SDA changes are allowed only during SCL low. Changes during SCL high are reserved for start and stop conditions described below.

The SCL serial clock input synchronizes data transfer from and to the device.

Pins $V_{SS}$ and $V_{CC}$ provide electrical ground and power supply (e.g., +1.8 V to 5.5 V), respectively.

I/O interface 12 and I/O control logic 14 communicate with memory control logic 15 which supplies inputs to HV (high voltage) generator 18, XDEC (X-line decoder) 19 and YDEC (Y-line decoder) 20 and also communicates with sense AMP (amplifier) R/W (read/write) control 22. The XDEC controls EEPROM array 25 with page latches 26 controlled by cache 27 and YDEC 20 which also communicates with sense AMP R/W control 22.

Device 10 is preferably fabricated using CMOS process technology for low power nonvolatile code and data applications. It may be packaged, for example, in an 8 pin (A0, A1, A2, $V_{SS}$, $V_{CC}$, NU (not used), SCL and SDA) DIP (dual in-line package) or SOIC (small outline integrated circuit) package.

Figure 2A:
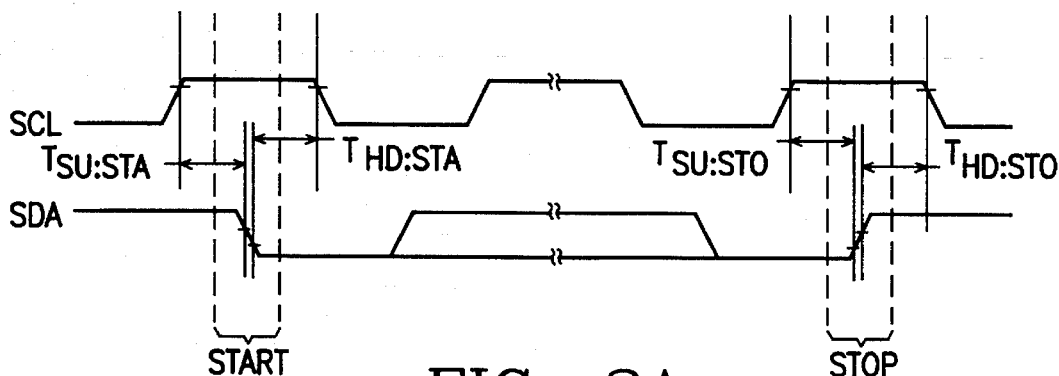
FIGS. 2A and 2B are timing diagrams for the data transmission bus of the device of FIG. 1.
Figure 2B:
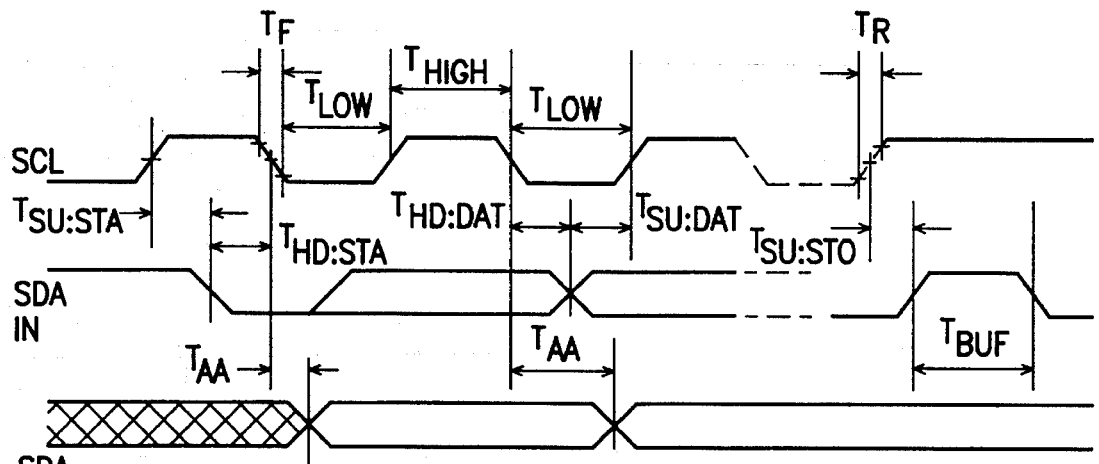

The EEPROM supports a bidirectional two wire bus and data transmission protocol. Bus timing start/stop and bus timing data are illustrated in FIGS. 2A and 2B, respectively. In the protocol, a transmitter sends data onto the bus, and a receiver receives the data. The bus is controlled by a master device that generates the serial clock SCL, controls the bus access, and generates start and stop conditions for data transfer. The EEPROM acts as a slave device, and, like the master, can operate as transmitter or receiver, but the master device determines which of those modes is activated.

FIGS. 2A and 2B assume an exemplary clock frequency of 400 KHz, with data transfer start and stop conditions generated during selected clock high times $T_{HIGH}$ (e.g., minimum of 600 nanoseconds (ns)). The clock high time $T_{HIGH}$ (e.g. 1300 ns) is the time between the approximate midpoints of the clock rise time $T_R$ (e.g., maximum of 300 ns) and fall time $T_F$ (e.g., max 300 ns). Similarly, the clock low time $T_{LOW}$ (e.g. 1300 ns) is the time between the approximate midpoints of the clock fall time and the clock rise time. The start condition hold time $T_{HD:STA}$ (e.g., min 600 ns) is the period after which the first clock pulse is generated. A start condition setup time $T_{SU:ST}$ (e.g., min 600 ns) is only relevant for repeated start conditions. Analogous considerations exist for stop condition hold time $T_{HD:STO}$ and setup time $T_{SU:STO}$ (e.g., min 600 ns).

Data input hold time and data input setup time are $T_{HD:DAT}$ (e.g., min 0 ns) and $T_{SU:DAT}$ (e.g., min 100 ns) respectively. When EEPROM 10 is a transmitter, it provides an internal minimum delay time $T_{AA}$ (e.g., max 900 ns) to bridge an undefined region (e.g., min 300 ns) of the falling edge of SCL to avoid unintended generation of start and stop conditions. The bus must be free for a time interval designated $T_{BUF}$ (e.g., min 1300 ns) before a new transmission can start.

Figure 3:
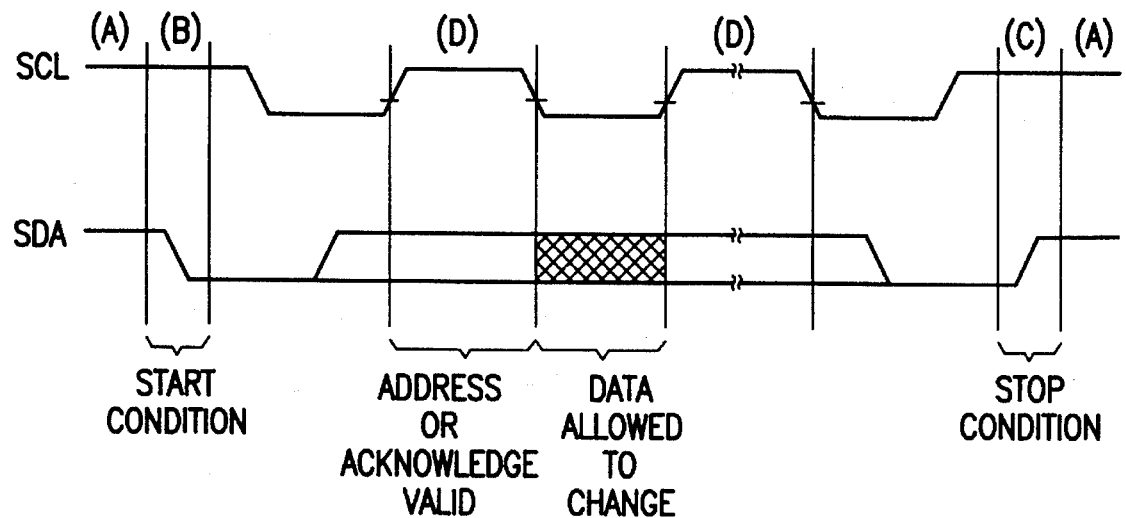
FIG. 3 is a data transfer sequence diagram for the EEPROM's serial bus.

The bus protocol of this 64K serial EEPROM device requires that (i) data transfer may be initiated only when the bus is not busy, and (ii) during data transfer, the data line must remain stable whenever the clock line is high because changes are interpreted as a start or a stop condition. The following bus conditions are thereby defined. In an illustrative data transfer sequence on the serial bus (FIG. 3), the bus is not busy (condition A) when both the serial data/address (SDA) and clock (SCL) lines remain high. A start data transfer (start condition, B) is determined by a high to low transition of the SDA line while the SCL line is high. All commands are preceded by a start condition. A stop data transfer (stop condition, C) is determined by a low to high transition of the SDA line while the SCL line is high. All operations are ended with a stop condition.

The state of the data (SDA) line represents valid data (D) when, after a start condition, the data line is stable for the duration of the high period of the clock (SCL) signal. Data on the SDA line may be changed only during the low period of the SCL signal, with one clock pulse for each bit of data. The master device determines the number of data bytes transferred between start and stop conditions, and an acknowledge signal is normally generated by the addressed receiving device after receipt of each byte.

Figure 4:
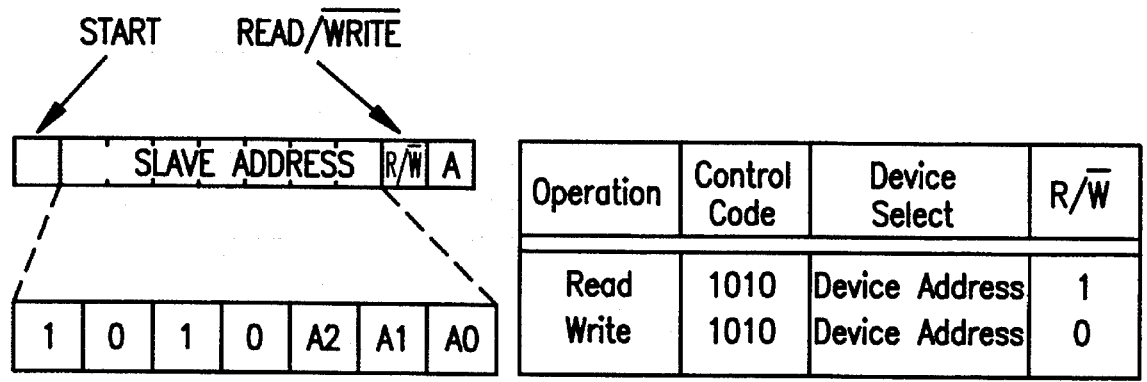
FIG. 4 is a chart illustrating the control byte allocation used for device addressing and operation.

The first byte received from the master after a start condition (S), as represented by reference number 41, is a control byte (allocation illustrated in FIG. 4), which includes a four bit control code, set as 1010 binary for read and write operations. The next three bits of the control byte are device select bits used by the master to select which of the eight slave devices is to be accessed. The last bit (R/$\overline{W}$) defines the operation to be performed, i.e., read or write. If set to 1, a read operation is selected; if set to 0, a write operation is selected. Bit A in FIG. 4 is the acknowledge bit, sent by the slave to indicate receipt of the previous eight bits. An acknowledge occurs after each byte transmitted in either direction.

Figure 5:
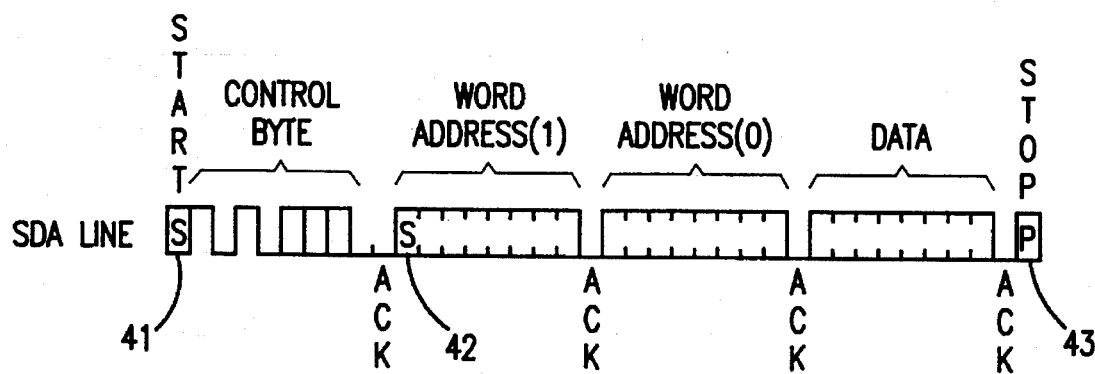
FIG. 5 is a bit stream diagram illustrating byte write operation.

The least significant thirteen bits of the next two bytes (WORD ADDRESS (1), WORD ADDRESS (0)) (FIG. 5) from the master device define the address of the byte on which the device will perform subsequent read or write operations. Following a start condition, as represented by reference number 42, the EEPROM monitors the SDA line for the device type identifier transmitted by the master. On receiving an appropriate code and device select bits, the selected slave outputs an acknowledge signal on the SDA line, and a read or write operation is selected depending on the state of the R/$\overline{W}$ bit.

In a byte write operation (FIG. 5), after the start condition, the device code, memory block address and R/$\overline{W}$ bit are transmitted by the master onto the bus. The addressed slave receiver is thereby informed that the word address will follow the control byte, after an acknowledge bit is generated. The word address transmitted by the master is written into an address pointer, and after acknowledgement is followed by transmission from the master of a data word (DATA) to be written into the addressed memory location. After the slave acknowledges, the master generates a stop condition (P), as represented by reference number 43.

Figure 6:
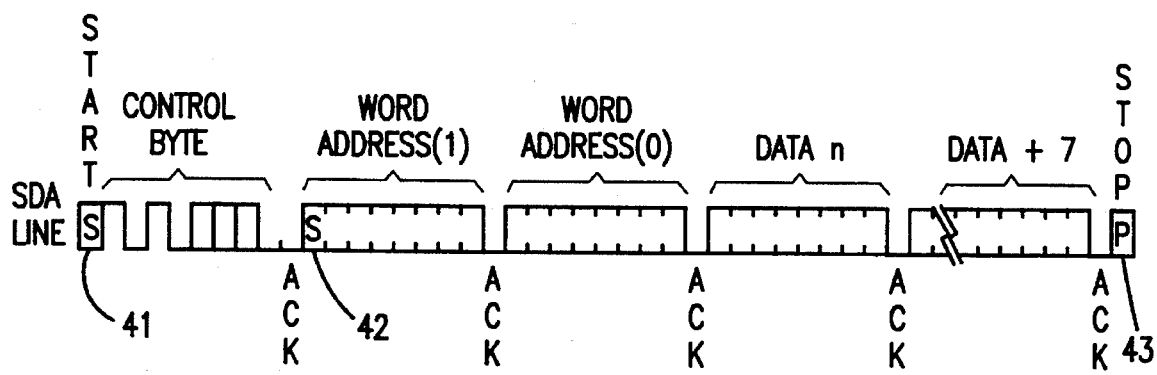
FIG. 6 is a bit stream diagram illustrating page write operation.

In a page write operation (FIG. 6), the write control byte, word address and first data byte are transmitted to EEPROM 10 in the same manner as for a byte write. But after acknowledgement of the data byte, the master transmits up to eight data bytes (DATAn–DATAn+7). As in the byte write case, after receipt of the stop condition from the master, the device commences an internal write cycle. Once a stop is transmitted, the write cycle starts and no more data bytes are acknowledged.

When writing data, the internal write cycle is executed as an automatic erase-then-write cycle. The total write cycle time interval $T_{WR}$ (erase plus write) is 2 milliseconds (ms) in length, with a maximum length of 10 ms, for a single page of eight bytes. The total time required for loading a greater number of pages into write cache 27 is the single page $T_{WR}$ multiplied by the total number of pages being written.

Figure 7:
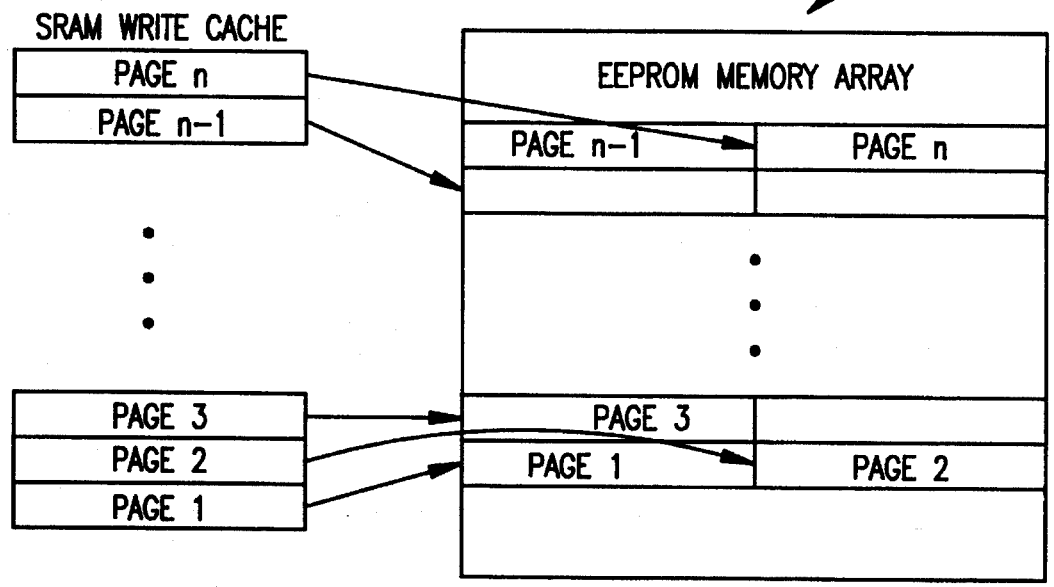
FIG. 7 is a simplified block diagram of the page mode write cache of the EEPROM device of FIG. 1, according to the invention.

A simplified block diagram of the page mode write cache of the serial EEPROM according to the invention is shown in FIG. 7. The cache 50 in this particular embodiment is composed of 64 bytes of SRAM organized in pages whose size is related to the row size of the EEPROM memory array 60. The maximum page size is limited to the size of one row of the memory array. By way of example, and not of limitation, the page size of the cache is equal to one-half the row size of the memory.

In practice, of course, the cache size is determined by the amount of SRAM used and the size of the internal memory array 60. The write cache 50 enables the EEPROM to receive a serial data stream as a burst of up to 64 bytes (in this example) at SRAM speeds.

During the loading cycle, the received data is stored by the SRAM write cache, one byte at a time and grouped into pages in the sequence of pages 1, 2, 3, . . . , n–1, n, where n is the number of bytes of data loaded into the cache divided by the number of bytes in a page, rounded to the next larger integer. In effect, the write cache 50 combines SRAM as a data buffer with page mode write. Conventional page mode write alone is unsuitable as a burst mode data buffer because of page mapping to memory array rows, which limits data buffer size to number of bytes in a single row of the memory array. On the other hand, the increased data buffer size of the SRAM, combined with page mode write in the write cache of the invention, enables the transmission of a large burst of data (up to the size of the SRAM) to the cache via a data bus, and, when that transmission is complete and the data stored in the cache, frees the bus for access by other data or instructions. This in turn, flees the CPU such as a microcontroller to perform other processing tasks, using the bus, until the next access to the EEPROM. Since the EEPROM device will not acknowledge if it is in a write cycle, during that cycle the microcontroller can do anything within its slate of tasks except access the EEPROM.

When the data burst ends, the programming cycle of the EEPROM commences, during which the data stored in page groupings in the SRAM write cache is written to the memory array 60 in sequential writes of one page at a time until the SRM write cache is depleted. The page size in the cache may have any value equal to 1/I times the size of each row in the memory array, where I is an integer greater than or equal to 1. For the sake of simplicity, the page size is shown as ½ the row size in FIG. 7, but that relative value might, for example, be ⅙. Each page of the cache is written to occupy its relative portion of a respective row of the memory, in sequence from the first page through the nth page. The total programming cycle can be executed in a time interval which is equivalent to the ratio of the amount of data stored in the write cache to the page size multiplied by the time required to complete one page write. Although this is not really an improvement over conventional EEPROM programming (E/W) time—for example, each page might require a write time of 2 ms, so that the total time taken to write the entire cache to the memory array would be (n×2 ms) in either case—the advantage of employing a page mode write cache according to the invention is that the controller can send a large amount of data in a burst and then proceed with other processing tasks while the EEPROM is writing.

Figure 8:
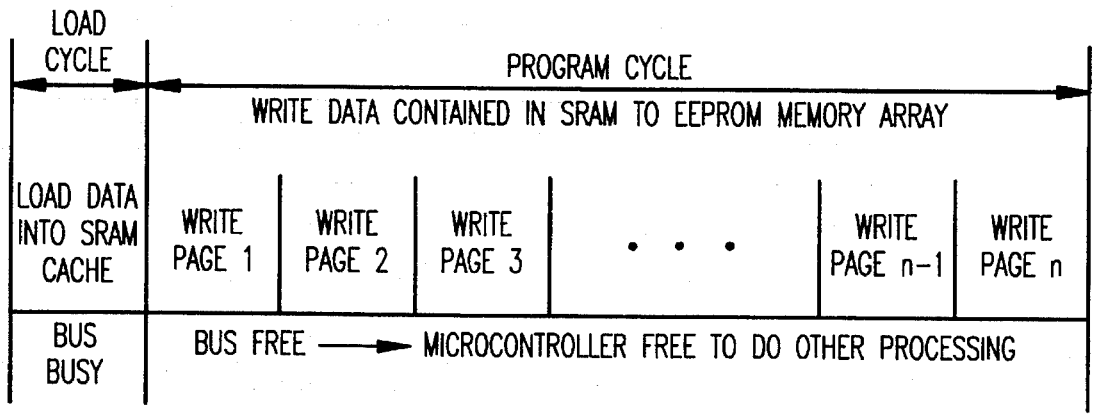
FIG. 8 is a timing diagram of the operation of the page mode write cache of FIG. 7.

The timing diagram of FIG. 8 illustrates the operation of the SRAM page mode write cache of FIG. 7, during the loading and programming cycles. Because this operation has just been described in connection with FIG. 7, there is no need for further explanation.

A preferred embodiment constituting the best mode presently contemplated for practicing the invention has been described. However, it will be apparent to those skilled in the art that modifications may be made without departing from the true spirit and scope of the invention. Accordingly, it is intended that the invention shall be limited only as required by the appended claims and the rules and principles of applicable law.

What is claimed is:

1. A serial EEPROM (electrically erasable programmable read only memory) device having an internal memory array to be written by data sent from a controller on a bus used to carry other data and instructions when the controller is performing other tasks, comprising:

SRAM (static random access memory) write cache means for receiving a burst of data from the controller on the bus, and for storing the received burst of data sequentially and grouped in a plurality of pages, the internal memory array having a plurality of rows of memory cells for storing data written therein from said SRAM write cache means, whereby when the internal memory array is being written sequentially from the pages of the SRAM write cache means after all data in the burst of data has been loaded into the SRAM write cache means, the bus is available to carry other data and instructions to permit the controller to perform other processing tasks, and means for writing the burst of data received by the SRAM write cache means to the memory array of the device in page by page sequence, each page having a size equal to that of the other pages of the SRAM write cache means which allows all of the data contained in a precise integral number of pages of the SRAM write cache means to be stored in a corresponding row of the internal memory array.

2. The serial EEPROM device of claim 1, wherein the page size of pages in the SRAM write cache means is equal to the size of each row of the internal memory array.

3. In combination, serial EEPROM (electrically erasable programmable read only memory) having an internal memory array which may be programmed by writing data thereto, a microcontroller for performing various tasks including sending a burst of data to be written to the internal memory array of the serial EEPROM upon gaining access to the serial EEPROM, a bus for carrying the burst of data sent by the microcontroller, as well as other data and instructions when the bus is accessible, an SRAM (static random access memory) write cache for receiving the burst of data carried by said bus and for storing the burst of data in a plurality of pages, so that when data in the burst of data has been loaded completely in the SRAM write cache and said internal memory array is being written with that data from the SRAM write cache, the bus is accessible and the microcontroller is free to perform other tasks, and means for writing the burst of data received by the SRAM write cache to the internal memory array of the serial EEPROM in page by page sequence, with each page being of equal size to the others and sized so that an integral number of pages of data from the SRAM write cache corresponds to a row of the internal memory array.

4. The combination of claim 3, wherein the page size of pages in the SRAM write cache is equal to the size of each row of the internal memory array.

5. A method of reducing the loading time of an EEPROM (electrically erasable programmable read only memory) having an internal memory array for receiving data sent by a microcontroller via a bus for programming the internal memory array, comprising the steps of:

loading a burst of data from the microcontroller into an SRAM (static random access memory) write cache for storing bytes of the burst of data sequentially in a plurality of pages of the SRAM write cache, writing the burst of data loaded into the SRAM write cache to the internal memory array of the EEPROM in page by page sequence, with each page being of equal size to the others and sized so that an integral number of pages of data from the SRAM write cache corresponds to a row of the internal memory array, and releasing the microcontroller to perform other tasks after the SRAM write cache is loaded and while the burst of data loaded in the SRAM write cache is being written to the internal memory array of the EEPROM sequentially on a page by page basis until the SRAM write cache is depleted.

* * * * *